US008638225B1

(12) United States Patent
Bocko et al.

(10) Patent No.: US 8,638,225 B1
(45) Date of Patent: Jan. 28, 2014

(54) INPUT SIGNAL POWER SENSING SENTRY

(75) Inventors: Mark F. Bocko, Caledonia, NY (US); Zeljko Ignjatovic, Rochester, NY (US)

(73) Assignee: University of Rochester, Rochester, NY (US)

( * ) Notice: Subject to any disclaimer, the term of this patent is extended or adjusted under 35 U.S.C. 154(b) by 867 days.

(21) Appl. No.: 12/836,184

(22) Filed: Jul. 14, 2010

Related U.S. Application Data

(63) Continuation of application No. 12/028,429, filed on Feb. 8, 2008, now abandoned.

(60) Provisional application No. 60/900,119, filed on Feb. 8, 2007.

(51) Int. Cl.
*G08B 21/00* (2006.01)
*G01R 13/14* (2006.01)
*G01C 22/00* (2006.01)

(52) U.S. Cl.
USPC .......................... 340/540; 324/76.24; 702/159

(58) Field of Classification Search
USPC .......................... 340/540; 324/76.24; 73/570
See application file for complete search history.

(56) References Cited

U.S. PATENT DOCUMENTS

| | | | | |
|---|---|---|---|---|
| 4,479,188 | A * | 10/1984 | de Keijzer | 702/74 |
| 6,108,529 | A * | 8/2000 | Vice et al. | 455/323 |
| 6,654,595 | B1 * | 11/2003 | Dexter | 455/323 |

* cited by examiner

*Primary Examiner* — Daniel Wu
*Assistant Examiner* — Mancil Littlejohn, Jr.
(74) *Attorney, Agent, or Firm* — William Greener; Daniel P. Malley; Bond, Schoeneck & King, PLLC

(57) ABSTRACT

The present invention is directed to a circuit device configured to monitor a sensor device. The sensor device is configured to measure a predetermined physical parameter and provide a sensor output signal corresponding to the predetermined physical parameter. The circuit device includes a sampling circuit configured to sample the sensor output signal to obtain a predetermined number (N) of sensor output signal samples. an analog multiplication circuit to generate one of a plurality of predetermined digital sequences. and an analog integrator circuit. configured to add the N multiplication products to generate an analog signal power estimation value which corresponds to a degree of correlation between the sensor output signal and the selected predetermined digital sequence.

42 Claims, 4 Drawing Sheets

INPUT SIGNAL POWER SENSING SENTRY

CROSS-REFERENCE TO RELATED APPLICATIONS

This is a continuation of U.S. patent application Ser. No. 12/028,429 filed on Feb. 8, 2008, the content of which is relied upon and incorporated herein by reference in its entirety, and the benefit of priority under 35 U.S.C. §120 is hereby claimed, U.S. patent application Ser. No. 12/028,429 claims the benefit of priority under 35 U.S.C. §119(e) to U.S. Provisional Patent Application No. 60/900,119, filed Feb. 8, 2007, the content of which is relied upon and incorporated herein by reference in its entirety into the present disclosure.

BACKGROUND OF THE INVENTION

1. Field of the Invention

The present invention relates generally to a sensor, and particularly to a sensor with reduced power use.

2. Technical Background

The rapidly growing demands for wireless sensing applications have introduced an urgent need for high complexity, power aware mixed-signal circuits. Integrating analog signal acquisition units (amplification, filtering, and analog-to-digital conversion), digital logic for signal processing and control, and RF capabilities into a single monolithic circuit results in the anticipated advantages of more efficient power management and energy allocation, lower cost, and smaller form factor. Due to the high degree of integration possible, modern CMOS technologies accommodate system-on-a-chip solutions for many applications; among them smart-sensor units (SSU's), where all required subsystems, both analog and digital, may be integrated into a single mixed-signal CMOS chip.

One possible specific realization of a SSU for use with a piezoelectric sensor is shown in FIG. 1. A typical unit 100 would include a sensing element 102, an analog signal processing unit, e.g., a charge preamplifier 104 and analog-to-digital converter (ADC) 106, control logic such as a microprocessor 108 with memory 110, a digital signal processing (DSP) unit 112 with memory 114, and a communication (COMM) module 116. The charge preamplifier amplifies the sensor signal to the level that matches the full dynamic range of the ADC. The ADC then converts the amplified analog signal to a digital format compatible with the digital logic circuits. Both the charge preamplifier and ADC work under the control of the micro-controller, which controls the amplifier gain and the ADC's resolution and bandwidth. The ADC may be either a Nyquist ADC, in which multi-bit samples are obtained at a rate equal to twice the signal bandwidth, or an oversampling sigma-delta ADC, in which low-bit samples are obtained at a much higher rate and subsequently decimated to high-resolution samples at a lower rate. The data are processed in the DSP unit which typically may perform filtering, spectrum analysis, correlation, statistical analysis (e.g. histogram calculation), and data compression if required for subsequent communications.

In modern designs, the micro-controller and DSP units are fused into a single control/signal-processing unit. The last element of the system is a communication unit (COMM) that connects the smart-sensor to the external world via wired or wireless links. The front-end of the Smart Sensor Unit, including the charge preamplifier and ADC, is in many ways the most critical part of the system. It determines the system's overall dynamic range and bandwidth, and furthermore, in sensor monitoring applications, the front end must be "on" nearly all of the time so it is the primary determinant of the overall system energy consumption.

Throughout the last two decades a great deal of research and development has been dedicated to analog-to-digital converters. There are two basic ADC types, Nyquist rate and oversampling. Oversampling ADC's based on sigma-delta ($\Sigma\Delta$) modulation have been employed in high-resolution and low to moderate bandwidth signal acquisition for such applications as instrumentation and biomedical measurements, digital audio, and ISDN. Nyquist rate ADC's have been used for low to moderate resolution and high-bandwidth applications. Although Nyquist rate converters may achieve higher bandwidth, over-sampling ADC's have several distinct advantages. Specifically, $\Sigma\Delta$ ADC's simplify integration by reducing the demands on the supporting analog circuits. For example, sharp roll-off anti-aliasing filters or highly precise sample-and-hold circuits are not required. Furthermore, oversampling ADC's are relatively tolerant of circuit non-idealities and component mismatch and therefore do not require post-fabrication trimming or calibration to achieve high resolution. The scaling of modern VLSI technologies, with the drive toward smaller and faster (but less precise) components to improve digital circuit performance, has created an opportunity for $\Sigma\Delta$ converters. Fundamentally, oversampling ADC's derive their performance from the speed of their circuit components, while Nyquist rate converters derive their performance from the precision of their circuit components, thus the oversampling ADC design approach is compatible with the trend in CMOS technology.

Another important advantage of $\Sigma\Delta$ ADC's is that they generally require lower power consumption for a given resolution and bandwidth than Nyquist ADC's. Furthermore, the high dynamic range of $\Sigma\Delta$ ADC's relaxes the requirements on the charge pre-amplifier, i.e., the gain does not have to be carefully matched to the ADC input range. Finally, switched-capacitor circuit technology, which is almost always used for $\Sigma\Delta$ ADC's, allows the $\Sigma\Delta$ ADC to be connected directly to piezoelectric elements, completely eliminating the need for impedance matching amplifiers. Thus the $\Sigma\Delta$ ADC architecture creates an opportunity to optimize the system by eliminating the charge-preamplifier.

An example of the optimized conventional structure is shown in FIG. 2 as 200. A comparison with FIG. 1 shows that the charge preamplifier 104 and the ADC 106 have been replaced with a $\Sigma\Delta$ ADC 206.

In most smart-sensing applications important events that require a full deployment of the network resources and end-user attention are generally infrequent. As a consequence, the SSU spends the vast majority of time monitoring an object during times of relative inactivity. During these periods of inactivity, the input signal from the transducer is not information bearing, and the SSU consumes its valuable energy resources to monitor such input signals seeking the onset of the information carrying signal part. Since the onset of the information carrying input signal is not predictable in practice, the SSU must perform a continuous monitoring. To perform this continuous monitoring "sentry" function, existing SSU's must employ all of their resources (typically an amplifier, ADC, followed by a DSP) to collect and analyze data. Typical ADC-DSP chips consume 10's of milliwatts of power (depending on the sample rate and computations performed) which severely limits battery life. For example, in vibration sensing one typically collects data at a 10 kHz sample rate and performs a spectral analysis of the data which requires about 50 milliwatts of power for the ADC-DSP; this would consume the charge of a Li-Ion battery of 1 cubic inch volume in about 1 week. A typical compromise is to employ the sensor with a limited duty cycle to preserve energy. When a change in status is detected one may proceed to take a more detailed "look" to assess and respond appropriately. However, in many applications such as surveillance, monitoring of structures etc. this reduced duty cycle monitoring is not a viable option, and continuous monitoring becomes necessary.

If the total signal power generated from the sensing element is of interest, the estimation algorithm and the required circuitry are rather simple. However, in applications such as machine monitoring, the signal of interest normally appears within a narrow bandwidth, surrounded by wide-band noise and/or strong interfering signals. Thus, the SSU must distinguish signals propagating within environmental noise and interference, i.e., the SSU must extract the spectrum of the signal in a noisy environment. The system shown in FIG. 2 could achieve this type of narrow band power estimation by using an analog bandpass filter at the analog front-end followed by the ADC and simple digital processing algorithms such as summation of the squared values from the ADC. However, passive narrow-band analog filters require complex networks of components and are inflexible. Active (switched capacitor) narrow band analog filters are expensive in terms of power consumption. Thus, these options would not be acceptable in the majority of applications.

As an alternative to analog front-end filters, the DSP unit could perform more complex operations, such as digital filtering. Although the power consumption of the SSU while performing narrow band power estimation can be minimized by optimizing the processing algorithm, this approach cannot radically lower the power consumption. As shown below, the other problem related to the power consumption issue is that even while performing power estimation, the ADC usually has to operate at full resolution to avoid the introduction of significant error. Thus, this approach will not achieve SSU energy efficiency.

What is needed is a sentry circuit configured to monitor a sensor output before employing conventional energy inefficient processing such that a deployed sensor manages its resources in a power efficient manner.

SUMMARY OF THE INVENTION

The present invention addresses the needs described above by providing a sentry circuit configured to monitor a sensor output before employing conventional energy inefficient processing such that a deployed sensor manages its resources in a power efficient manner. During periods of inactivity, the sentry circuit of the present invention continuously observes an input sensor signal while consuming power in the nano-Watt (nW) range. Once the sentry circuit detects increased activity, the sensor system may deploy all of its resources and its full data processing capacity, e.g., full resolution, full speed, data processing algorithms, etc. to process the input sensor signal.

One aspect of the present invention is directed to a circuit device configured to monitor a sensor device. The sensor device is configured to measure a predetermined physical parameter and provide a sensor output signal corresponding to the predetermined physical parameter. The circuit device includes a sampling circuit configured to sample the sensor output signal at a predetermined sampling rate to thereby obtain a predetermined number (N) of sensor output signal samples, N being an integer value. An analog multiplication circuit is coupled to the sampling circuit. The multiplication circuit is selectably reconfigurable to generate any one of a plurality of predetermined digital sequences. Each predetermined digital sequence of the plurality of predetermined digital sequences includes a sequence of N coefficients. The multiplication circuit is configured to multiply each sensor output signal sample by a corresponding coefficient in a selected predetermined digital sequence to thereby generate a sequence of N multiplication products. An analog integrator circuit is coupled to the analog multiplication circuit. The analog integrator circuit is configured to add the N multiplication products to generate an analog signal power estimation value. The analog signal power estimation value corresponds to a degree of correlation between the sensor output signal and the selected predetermined digital sequence.

In another aspect, the present invention is directed to an alarm circuit includes a sensor configured to measure a predetermined physical parameter and provide a sensor output signal corresponding to the predetermined physical parameter. A sampling circuit is configured to sample the sensor output signal at a predetermined sampling rate to thereby obtain a predetermined number (N) of sensor output signal samples, N being an integer value. An analog multiplication circuit is coupled to the sampling circuit. The multiplication circuit is selectably reconfigurable to generate any one of a plurality of predetermined digital sequences. Each predetermined digital sequence of the plurality of predetermined digital sequences includes a sequence of N coefficients. The multiplication circuit is configured to multiply each sensor output signal sample by a corresponding coefficient in a selected predetermined digital sequence to thereby generate a sequence of N multiplication products. An analog integrator circuit is coupled to the analog multiplication circuit. The analog integrator circuit is configured to add the N multiplication products to generate an analog signal power estimation value. The analog signal power estimation value corresponds to a degree of correlation between the sensor output signal and the selected predetermined digital sequence. A processing circuit is coupled to the analog integrator circuit. The processing circuit being configured to process the analog signal power estimation value to determine whether the analog signal power estimation value corresponds to an alarm condition.

In yet another aspect, the present invention is directed to a sensor system includes a sensor configured to measure a predetermined physical parameter and provide a sensor output signal corresponding to the predetermined physical parameter. A sampling circuit is configured to sample the sensor output signal at a predetermined sampling rate to thereby obtain a predetermined number (N) of sensor output signal samples, N being an integer value. An analog multiplication circuit is coupled to the sampling circuit. The multiplication circuit is selectably reconfigurable to generate any one of a plurality of predetermined digital sequences. Each predetermined digital sequence of the plurality of predetermined digital sequences includes a sequence of N coefficients. The multiplication circuit is configured to multiply each sensor output signal sample by a corresponding coefficient in a selected predetermined digital sequence to thereby generate a sequence of N multiplication products. An analog integrator circuit is coupled to the analog multiplication circuit. The analog integrator circuit is configured to add the N multiplication products to generate an analog signal power estimation value. The analog signal power estimation value corresponds to a degree of correlation between the sensor output signal and the selected predetermined digital sequence. A detector circuit is coupled to the analog monitoring circuit. The detector circuit is configured to evaluate the analog signal power estimation value in accordance with a predetermined detection rule and generate an alarm signal if the analog signal power estimation value substantially corresponds to the predetermined detection rule. A signal processing unit is coupled to the sensor and the detector circuit. The signal processing unit is configured to operate in a minimal power mode such that the signal processing unit is substantially deactivated. The signal processing unit is activated in response to the alarm signal to thereby enter an operational mode. The signal processing unit is configured to process the sensor output signal in the operational mode. The signal processing unit is configured to consume a second predetermined power amount in the operational mode.

The sentry circuit of the present invention continuously monitors the input signal while consuming very little power, albeit with a somewhat reduced resolution and speed. In fact, the sentry circuit may be configured to monitor only a portion of the input sensor signal, as a function of time and/or frequency, to detect the onset of a sensor information carrying signal. However, the negligible power consumption feature of the present invention is more than an acceptable tradeoff. For example, in a bearing monitoring application, the sentry circuit may be configured to estimate the input signal power within a narrow frequency band (e.g., 3-5 kHz) instead of the entire spectrum (i.e., total signal power), and generate an alarm if the integrated vibration power in the band exceeds a predetermined application specific level. If an alarm is generated, the DSP is activated; otherwise, it is deactivated and is not consuming power. The power consumed by the sentry circuit (and hence the entire system) is in the nano-Watt (nW) range in this mode. Only when the sensor system is fully activated will the present invention provide a burst of high-resolution data necessary for detailed analysis by a DSP. Only in this mode will the DSP perform a detailed spectral analysis of the data captured by the high-precision ADC to record the exact frequency and magnitudes of discrete vibration peaks in the power spectrum.

In contrast, conventional sensors repetitively generate and process large volumes of raw data to obtain a relatively small amount of useable information by digital computation. Thus, the conventional approach represents a wasteful use of sensor energy resources. The present invention, on the other hand, represents a qualitatively new approach by directly sensing only useful information from the sensed environment to thereby reduce unit power consumption, size, complexity and cost. In vibration, acceleration, and acoustic sensing applications, for example, the signal of interest is expected within a narrow frequency band surrounded by wide-band noise and/or strong interfering signals. Therefore, the sentry circuit is configured to distinguish the signal of interest from environmental noise and interference signals, derive the signal spectrum of the sensor output signal, and estimate the signal power within a narrow frequency band while consuming negligible power. Thus, the present invention represents a new paradigm that provides the key to making ubiquitous, battery powered wireless sensors a practical reality.

Additional features and advantages of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description are merely exemplary of the invention, and are intended to provide an overview or framework for understanding the nature and character of the invention as it is claimed. The accompanying drawings are included to provide a further understanding of the invention, and are incorporated in and constitute a part of this specification. The drawings illustrate various embodiments of the invention, and together with the description serve to explain the principles and operation of the invention.

DETAILED DESCRIPTION

Figure 1:
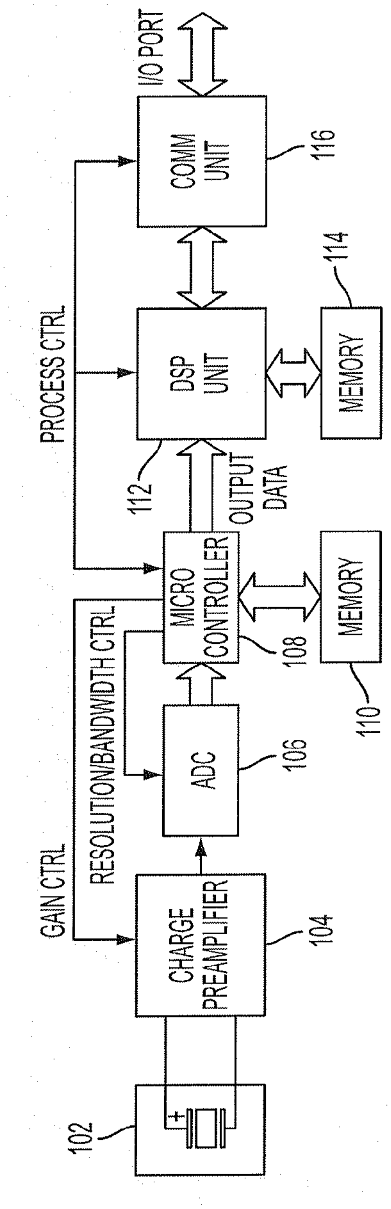
FIG. 1 is a block diagram showing a conventional smart-sensor unit.
Figure 2:
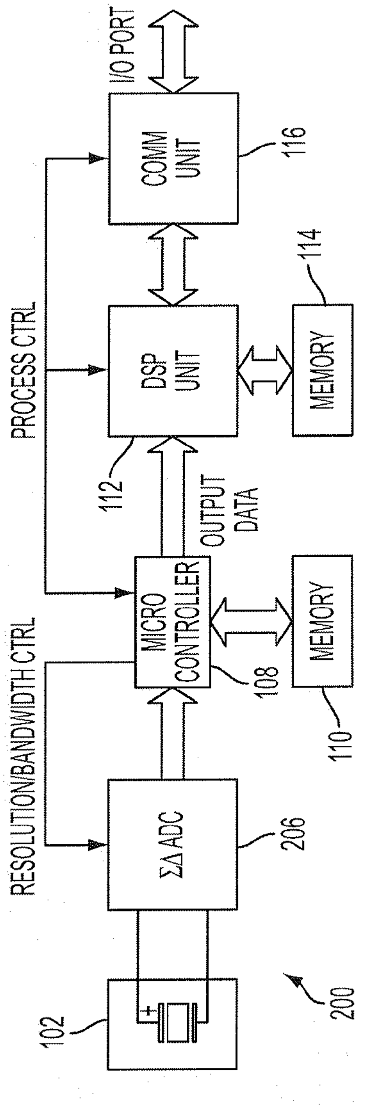
FIG. 2 is block diagram showing another conventional smart-sensor unit using a sigma-delta (ΣΔ) ADC.

Reference will now be made in detail to the present exemplary embodiments of the invention, examples of which are illustrated in the accompanying drawings. Wherever possible, the same reference numbers will be used throughout the drawings to refer to the same or like parts. Embodiments of the present invention are shown in the accompanying Figures.

As previously described, the present invention includes a sentry circuit that provides continuous monitoring of the input signal while consuming currents that are comparable to battery leakage currents, i.e., in the nW range. The sentry circuit provides the reduced power consumption by performing analog signal processing of the input signal to extract the sought-for information such that the following Analog-to-Digital Conversion and digital-signal processing are vastly simplified in terms of bandwidth (computational load). The sentry circuit is application and input signal specific. For example, in vibration sensor applications, the sentry circuit may perform a Hadamard Transform of the input signal, where the input signal samples are multiplied with a single-bit Hadamard vector (a two level sequence of 1's and −1's) and then summed to obtain a Hadamard coefficient that is proportional to the square-root of the input signal power in the frequency bands corresponding to the aforementioned Hadamard vector. Effectively, the circuit estimates the power spectral density of a piezoelectric vibration sensor signal in any user-selectable band of frequencies defined by a specific Hadamard vector.

With respect to the errors that arise within power spectrum estimation techniques, the sentry circuit of the present invention has relatively high energy efficiency by providing lowered resolution and speed. The lowered resolution means that data is quantized more coarsely than when the conventional digital signal processing operations are required.

The present invention addresses the question of whether data should be quantized in the time domain, which would relax the requirements on the ADC thereby reducing the power consumption, or whether data should be quantized in the frequency domain, eliminating the possibility to reduce the power consumption of the ADC.

For purposes of modeling, the present invention assumes that the quantization process adds a zero-mean white-noise $e[n]$ to the value that is to be quantized. Without quantization, the Fourier transform coefficients of the input signal (sampled N times) are given by Eq. (1).

$$X_{ideal}(k)=\sum_{n=0}^{N-1}x[n]e^{-j\frac{2\pi kn}{N}} \tag{1}$$

In the case where quantization is performed in the time domain, the resulting Fourier equations are given by:

$$X_{noisy}(k)=\sum_{n=0}^{N-1}(x[n]+e[n])e^{-j\frac{2\pi kn}{N}} \tag{2}$$

The mean-square-error of the kth Fourier coefficient is given by:

$$\begin{aligned}\sigma^2_{X_{noisy}(k)}&=E[X_{noisy}(k)X^*_{noisy}(k)]\\&=\sum_{n=0}^{N-1}\sum_{m=0}^{N-1}E[e[n]e[m]]e^{-j\frac{2\pi kn}{N}}e^{-j\frac{2\pi km}{N}}\\&=N\cdot\sigma_e^2\end{aligned} \tag{3}$$

In the case where the quantization is performed in the frequency domain, the resulting Fourier coefficients are given by:

$$X_{noisy}(k)=\sum_{n=0}^{N-1}x[n]e^{-j\frac{2\pi kn}{N}}+e(k) \tag{4}$$

The mean-square-error of the kth Fourier coefficient is given by:

$$\begin{aligned}\sigma^2_{X_{noisy}(k)}&=E[X_{noisy}(k)X^*_{noisy}(k)]\\&=\sigma_e^2\end{aligned} \tag{5}$$

If one assumes that the same resolution of the quantizer is used for both cases, the second approach has 1/N times the mean-squared-error of the first approach. Thus, quantization should be performed in the frequency domain rather than in the time domain, meaning that the resolution requirements on the ADC cannot be relaxed, i.e., there can be no significant ADC power reduction during the power estimation phase. Thus we are led to the alternative approach described below.

The model referred to herein describes an analog circuit that enables computation of chosen spectral components of an input signal directly in the frequency domain. The output of this circuit may then be quantized to the desired level of precision. This innovation enables one to avoid the use of narrow band analog filters or high dynamic range (and power consuming) time domain analog to digital conversion.

Accordingly, the circuit of the present invention operates at a speed that is no greater than the Nyquist frequency for the expected input signal, i.e., twice the input signal frequency. By calculating the spectral components in the analog domain, their resolution would be virtually infinite, depending upon the intrinsic noise of the circuit and the integration time. Following the analog spectrum-calculation unit, the present invention employs a low-resolution quantizer to digitize the spectral components. When the spectral components are observed independently, the quantizer of the present invention may be implemented as a uniform quantizer. However, if the total power of more than one spectral component is of interest, the quantizer could be realized as a square-law quantizer. This way, the quantizer produces digitized squared values of the spectral components ready for summation. A simple digital logic circuit such as an adder may be used to sum the quantizer outputs, resulting in an estimate of the signal power.

To synthesize a design for the power-estimation circuit one begins by observing the Fourier Transformation formula given by Eq. (1). This formula can be written in terms of the cosine functions given by:

$$X(k)=\sum_{n=0}^{N-1}x[n]\cos\left(\frac{2\pi kn}{N}\right)-j\sum_{n=0}^{N-1}x[n]\cos\left(\frac{2\pi kn}{N}-\frac{\pi}{2}\right) \tag{6}$$

Eq. (6) implies that the analog power-estimation circuit should perform multiplications of the input signal samples with the appropriate samples of the cosine basis function. However, in general, the basis function samples are complex roots of unity, and analog circuits capable of completing operations on complex numbers would be drastically more complicated than circuits that operate on real-valued inputs.

However, if we observe a subset of Fourier coefficients such as k={0, N/4, N/2}, the complexity of the required analog circuits is significantly reduced. The Fourier coefficients k={0, N/4, N/2} are given by:

$$X_F(0)=\sum_{n=0}^{N-1}x[n] \tag{7a}$$

$$X_F\left(\frac{N}{4}\right)=\sum_{n=0}^{N-1}x[n]\cos\left(\frac{n\pi}{2}\right)-j\sum_{n=0}^{N-1}x[n]\sin\left(\frac{n\pi}{2}\right) \tag{7b}$$

$$X_F\left(\frac{N}{2}\right)=\sum_{n=0}^{N-1}x[n]\cos(n\pi) \tag{7c}$$

It can be seen from Equations. (7a)-(7c) that the input signal is multiplied by Fourier basis functions that are easily related to a subset of the Hadamard basis functions. These relations are derived as follows. The temporal values of the aforementioned Fourier basis functions are given by:

$$\cos(n\cdot 0)=[1111\ldots 1]_{1\times n},\ n=0,1,\ldots N-1 \tag{8a}$$

$$\cos\left(\frac{n\pi}{2}\right)=[10-101\ \ldots]_{1\times n},\ n=0,1,\ldots N-1 \tag{8b}$$

$$\sin\left(\frac{n\pi}{2}\right) = [010-10\ \ldots]_{1\times n},\ n=0,1,\ \ldots\ N-1 \quad (8c)$$

$$\cos(n\pi)=[1-1\ 1-1\ \ldots]_{1\times n},\ n=0,1,\ \ldots\ N-1 \quad (8d)$$

Note that the Hadamard basis functions include timing and frequency information. The Hadamard basis function in equation 8a represents a constant D.C. value (i.e., at zero frequency). When the argument of the cosine term includes π/2 or multiples thereof, the Hadamard function is like a phasor rotating in 90° increments around the complex plane (i.e., 1, 0, −1, 0, etc.). The sine term is merely shifted by π/2 and the phasor rotates in similar fashion (i.e., 0, 1, 0 −1, etc.). When the argument of the cosine term includes π, or multiples thereof, the phasor of the basis function rotates twice as fast, in 180° increments, around the complex plane (i.e., 1, −1, etc.). The subset of the Hadamard basis functions which is related to the Fourier subset is given by:

$$H_1=[1\ 1\ 1\ 1\ \ldots]_{1\times N} \quad (9a)$$

$$H_2=[1-1\ 1-1\ \ldots]_{1\times N} \quad (9b)$$

$$H_3=[1\ 1-1-1\ \ldots]_{1\times N} \quad (9c)$$

$$H_4=[-1\ 1\ 1-1\ \ldots]_{1\times N} \quad (9d)$$

In order to calculate the Hadamard coefficients, the analog power-estimation circuit computes the function given by:

$$X_{H_k} = \sum_{n=0}^{N-1} x[n]\cdot H_k[n] \quad (10)$$

Thus, the sentry circuit estimates the above-mentioned Hadamard components (or other suitable basis function components) to perform an input signal sign alternation, (when it is called for) and summation (integration with a reset function).

From Equations. (7a) through (9d), we may find the relations between the Fourier transform and Hadamard transform coefficients, given by Equations. (11a)-(11c), where $X_{H_1}$, $X_{H_2}$, $X_{H_3}$ and $X_{H_4}$ are the Hadamard transform coefficients that are associated with the Hadamard basis functions $H_1$, $H_2$, $H_3$ and $H_4$, respectively.

$$|X_F(0)|^2=|X_{H_1}|^2 \quad (11a)$$

$$\left|X_F\left(\frac{N}{4}\right)\right|^2 = \frac{|X_{H_3}|^2+|X_{H_4}|^2}{2} \quad (11b)$$

$$\left|X_F\left(\frac{N}{2}\right)\right|^2 = |X_{H_2}|^2 \quad (11c)$$

Once the Hadamard transform coefficients are calculated, the associated Fourier transform coefficients are uniquely defined. In other words, after estimating the Hadamard coefficients, there is no need to calculate the Fourier coefficients. It can be shown that each Fourier coefficient (not only the ones mentioned here) could be uniquely represented by a Hadamard coefficient. However, the relations between the Fourier and Hadamard coefficients for other than k=0, N/4, and N/2, are more complex, and would complicate the digital logic. In any event, the Hadamard coefficients $X_{H_1}$, $X_{H_2}$, $X_{H_3}$ and $X_{H_4}$ are all that is required to enable the power-estimation algorithm.

Figure 3:
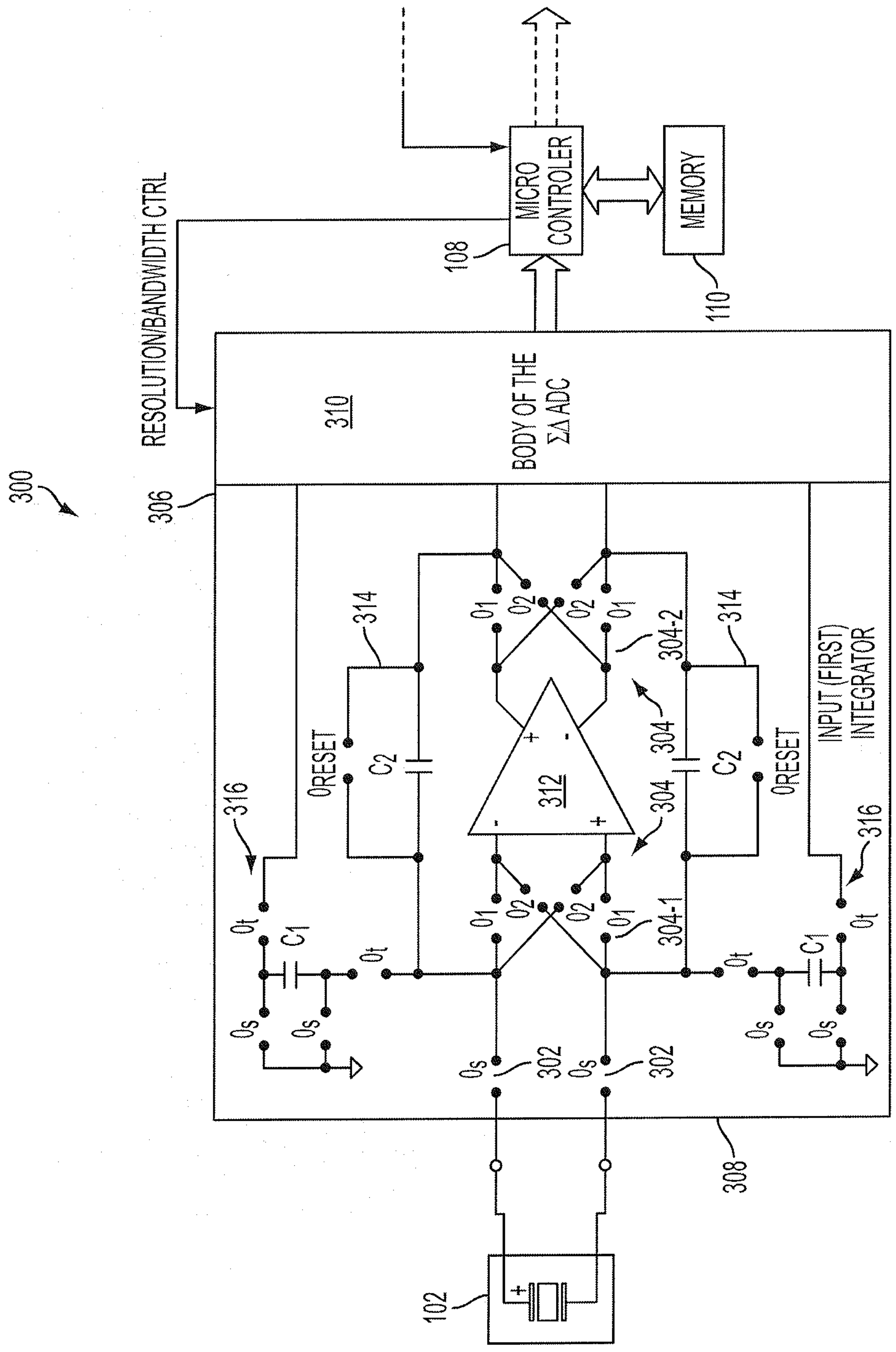
FIG. 3 is a circuit schematic of a sentry circuit in accordance with one embodiment of the present invention.

As embodied herein and depicted in FIG. 3, a circuit schematic of a sentry circuit 306 in accordance with one embodiment of the present invention is disclosed. The sentry circuit 306 forms the front-end of the SSU 300 employing a ΣΔ ADC and is realized in switched-capacitor technology. FIG. 3 shows a piezoelectric sensor element 102 as the signal source (although a wide range of sensor types may be employed) and its connection to the ΣΔ ADC. The ΣΔ ADC is separated into its front-end 308, which includes the first integrator 312 of the ΣΔ ADC, and the remainder of the ΣΔ ADC body 310. The sensor input signal provided by sensor 102 is sampled by the sampling clock ($\phi_s$) 302. The sampled signal x[n] is modulated to a higher frequency by modulator 304-1 and demodulated by demodulator 304-2. Modulator 304-1 and demodulator 304-2 are driven by the clock phase signals $\Phi_1$,$\Phi_2$ and form the chopper stabilization circuit 304 for the operational amplifier integrator 312. The required ΣΔ ADC feedback loop is realized with the capacitors $C_1$ and associated switches. Clock phase signals $\Phi_S$ and $\Phi_t$ drive the feedback loop. The gain of the amplifier, of course, is equal to the ratio of $C_1/C_2$. The switches driven by the $\Phi_{reset}$ clock phase serve to reset the integrator's state. Thus, circuit 300 samples the sensor input signal N times during a typical interval between reset pulses.

It will be apparent to those of ordinary skill in the pertinent art that modifications and variations can be made to sensor 102 of the present invention depending on the physical environment that is being monitored by the present invention. For example, sensor 102 may be an accelerometer, a vibrational sensor, a strain sensor, a force sensor, a torque transducer, a pressure transducer, capacitive transducer, or an inductive transducer. The sensor 102 may be configured to monitor acceleration, vibration, strain, torque, force, pressure, acoustic signals, electric fields, magnetic fields, electromagnetic signals, or optical signals. Moreover, the present invention should not be construed as being limited to the aforementioned examples.

Figure 4:
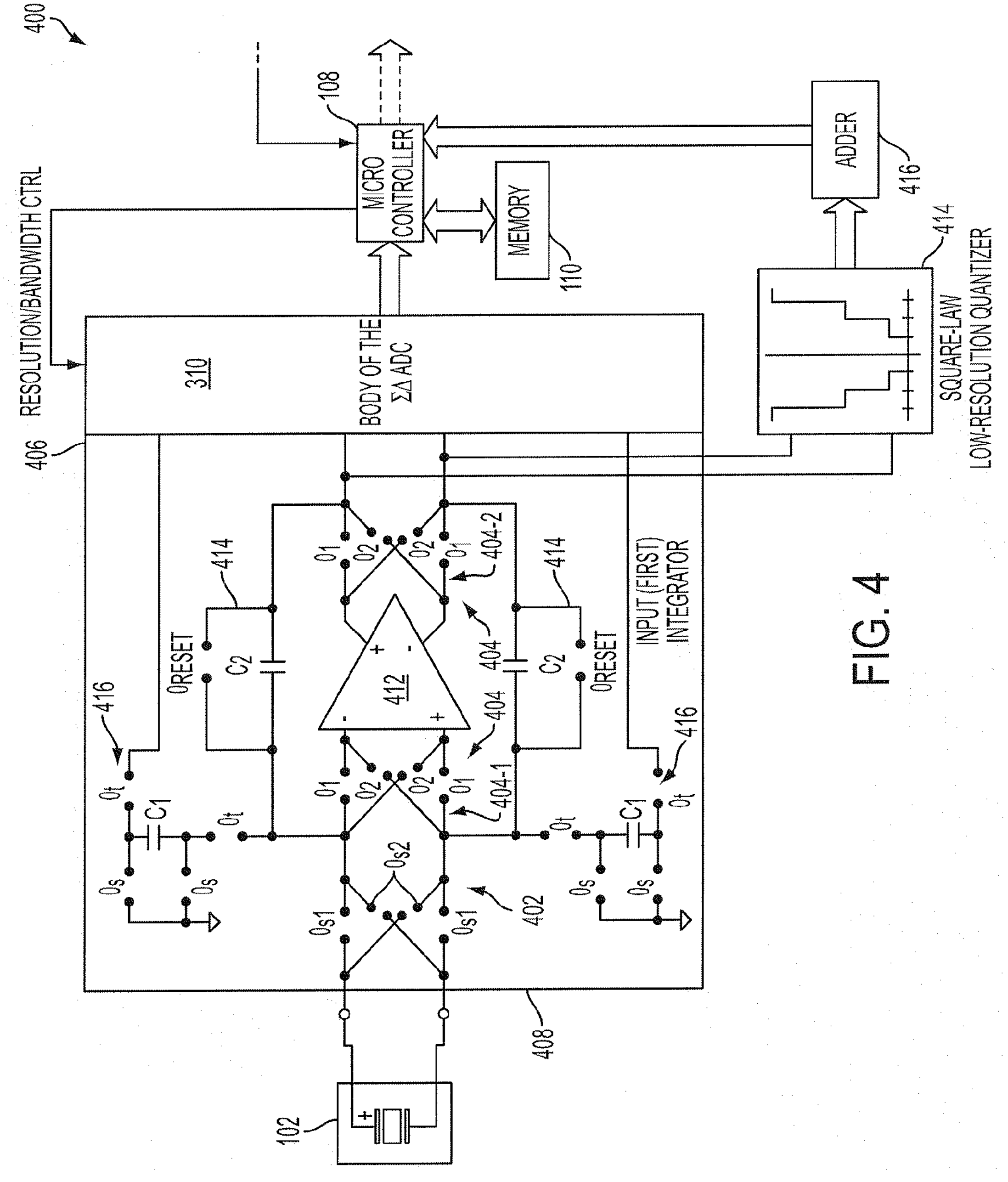
FIG. 4 is a circuit schematic of a sentry circuit in accordance with an alternate embodiment of the present invention.

As embodied herein and depicted in FIG. 4, a circuit schematic of a sentry circuit 406 in accordance with an alternate embodiment of the present invention is disclosed. The embodiment of FIG. 4 includes a more sophisticated analog multiplication circuit 402, which is disposed between the sensor 102 output and the modulator portion 404-1 of the chopper stabilization circuit 404. Analog multiplication circuit 402 includes a matrix of switches driven by clock signals $\Phi_{s1}$ and $\Phi_{s2}$. Those of ordinary skill in the art will recognize that the analog multiplication circuit 402 may be selectably reconfigured by a user to generate any one of a plurality of predetermined digital sequences. As before, each digital sequence includes a sequence of N coefficients between integrator 412 reset pulses. As those of ordinary skill in the art will appreciate, the sequence of clock signals $\Phi_{s1}$ and $\Phi_{s2}$ may be varied to select any suitable sequence. Thus, the analog multiplication circuit 402 multiplies each sensor output signal sample by a corresponding coefficient in a selected digital sequence to thereby generate a sequence of N multiplication products. The digital sequences generated by multiplication circuit 402 may include any suitable quantized function such as Fourier sine basis functions, Fourier cosine basis functions, Hadamard basis functions, etc.

The analog output value from the first integrator 412 provides the sought for Hadamard transform (frequency domain) coefficients which may subsequently be output to a quantizer.

When the sensor system is in the low power, power-estimation mode, the control logic turns off everything except the sentry circuit 306, the external low-resolution square-law quantizer 414 and an adder 416. The switches driven by the clock phase $\Phi_s$, $\Phi_r$, and $\Phi_2$ are off. The switch $\Phi_1$ is on, so the chopper stabilization is inactive. The control logic determines the sampling frequency, which is much lower than the sampling frequency when the ADC is in full operation, and sets the clock phase signals $\Phi_{s1}$ and $\Phi_{s2}$ according to, e.g., the Hadamard basis function that is to be used. Thus, the input signal samples are either sign alternated or not according to the basis function value. Once the input signal samples are obtained and summed within the integrator structure, the low-resolution square-law quantizer digitizes the analog integrator output value, which corresponds to the Hadamard coefficient, and produces its squared value. Once the digital squared value of the Hadamard coefficient is obtained, which represents the signal power within the particular frequency bin, the switches $\Phi_{reset}$ sets the initial conditions of the integrator.

The choice of the particular Hadamard basis function is application specific. If the input signal power is to be estimated within a baseband (around DC), the Hadamard function $H_1$ would be used. In this case the sampling frequency $f_s$ is chosen such that it would not allow high-frequency interfering tones to fold back into the baseband. For example, if the strong interfering signal is expected at the frequency $f_{tone}$, the sampling frequency should be chosen such that $fs>f_{tone}$. Another requirement is that the sampling frequency should be chosen such that the analog wide-band noise power within the baseband is lower than the expected signal power that is to be detected. The frequency resolution is determined by the number of input signal samples (N) that are integrated and is given in terms of −3 dB bandwidth (BW) by:

$$BW \equiv \frac{0.6 \cdot f_s}{N} \tag{12}$$

For example, if a sampling frequency of 10 k Hz is used, and a total of 1000 samples is integrated, the −3 dB bandwidth is equal to 6 Hz. In other words, the power of any input signal within the range from 0 to 6 Hz would be captured by the Hadamard coefficient $X_{H_1}$. The present invention is highly adaptable in terms of frequency resolution; the control logic adjusts the frequency resolution simply by changing the number (N) of acquired input signal samples.

If the input signal power is to be estimated within a narrowband centered on $f_c$, rather than in the baseband, one or two of the other three Hadamard basis function are used. The simpler and least power demanding approach uses only the Hadamard basis $H_2$. In this case the control logic sets the sampling frequency to the value that is twice the input signal center frequency ($f_s$=2$f_c$. Like the baseband case, the frequency resolution of the estimated Hadamard coefficient is determined by the choice of the number of input signal samples (N) that are integrated with the −3dB bandwidth given by Eq. (12).

In both cases mentioned above, the squared quantized Hadamard coefficient value provides enough information about the power within the narrow band at the observed spectral location. Thus, there is no need to perform additional digital operations. The quantizer output value is compared to a threshold; if the pre-specified threshold conditions are met, the control logic switches the circuit to the full operation regime.

If there is significant power in the signal at frequencies above the sampling frequency there is the possibility of aliasing. To avoid this, an alternative approach may be employed wherein the control logic sets the sampling frequency to four times the input signal center frequency ($f_s$=4$f_c$). In this embodiment, the Hadamard basis functions $H_3$ and $H_4$ are used jointly. First, the squared value of the Hadamard coefficient $X_{H_3}$ is obtained, followed by the squared value of the Hadamard coefficient $X_{H_4}$. These values are added in the digital domain to estimate $|X(N/4)|^2$ This approach requires only one digital addition.

In the full power mode, the switching pair $\Phi_{s1}$ and $\Phi_{s2}$ is inactive and the integrator becomes a part of the ΣΔ ADC structure. Also, the sampling frequency is set to a much higher value in order to obtain a full resolution and bandwidth of the ΣΔ ADC. The SSU performs data acquisition and required data processing. When the required data processing algorithms are finished, the SSU goes back to the power-sensing mode.

Although the first integrator (312, 412) of the ΣΔ ADC might be used within the proposed power-sensing sub-system, the integration function may be realized externally to the ΣΔ ADC by employing a separate integrator that is not part of the ΣΔ ADC. In this embodiment, the sentry circuit (300, 400) is externalized and may be biased with lower currents than the integrators of the ΣΔ ADC due to the relaxed requirements on its precision while working in the power-sensing mode. In an extreme situation the external sentry circuit embodiment may be biased in the sub-threshold regime resulting in nano-Watt range power consumption. According to David Yang, Boyd Fowler, and Abbas Gamal, "A 128×128 pixel CMOS Area Image Sensor with Multiplexed Pixel Level A/D Conversion," *Proceedings of IEEE* 1996 *Custom Integrated Circuits Conference*, San Diego, Calif., May 1996, the integrator and quantizer, while operating in sub-threshold regime, would consume less than 30 nW of power. In comparison to the proposed design, if one used Texas Instruments' MSC1211 system that employs a ΣΔ ADC controlled by 8051 CPU, it would consume around 4 mW in order to monitor a single spectral component. Thus, the present invention has at least five orders of magnitude lower power consumption than a conventional design.

In another embodiment, the sentry IC calculates the cross-correlation factor between the input signal samples and a multiple level basis function (transform sequence), where the multiple level basis function has most of its power in the frequency bands of interest. The cross-correlation factor is proportional to the square-root of the input signal power within the frequency bands of interest. The number of levels in the multiple level basis function affects the precision of the power spectral density estimation (i.e., more levels allow for better precision) and the complexity of the sentry IC (i.e., more levels in the sequence indicate higher circuit complexity). In addition, the length N of the basis function defines the frequency resolution BW of the measurement, as shown in Equation (12), where f, represents the sampling frequency used to obtain the discrete-time basis function.

An example of this embodiment is provided as follows. The frequency band of interest is located at center frequency $f_c$ and the sampling frequency required by the sensing application is equal to $f_s$. In order to estimate the power in the vicinity of $f_c$, we quantize a unity-amplitude sinusoidal wave form h[n] provided in Equation (13) to a three-level (−1, 0, and 1) quantized sequence Mid as shown in Equation (14).

$$h[n] = \sin\left(\frac{2\cdot\pi\cdot f_c\cdot n}{f_s}\right), n = 0, 1, 2, \ldots, N \quad (13)$$

$$h_Q[n] = \begin{cases} 1, & h[n] > \frac{1}{3} \\ 0, & -\frac{1}{3} < h[n] < \frac{1}{3} \\ -1 & h[n] < -\frac{1}{3} \end{cases} \quad (14)$$

Since the basis function $h_Q$ is a quantized version (i.e., triangular waveform) of the sinusoidal waveform, it will contain discrete spectral tones at integer multiples of the center frequency $f_C$ that result from the quantization operation. In the following text, the undesired spectral content of the basis function that is not located around $f_C$ is referred to as the quantization noise. If this sequence $h_Q$, is used as a basis function (or transform sequence), the resulting cross-correlation factor will include a portion of the input signal power located at the integer multiples of the $f_c$ resulting in spectral crosstalk (i.e., input signal spectral power located at $k*f_C$, k=2, 3, . . . will fold back into the baseband around the center frequency $f_C$). The discrete spectral tones of the basis function at the integer multiples of the center frequency $f_C$ (quantization noise) are highly undesirable since any interference that is present at these spectral locations of the input signal will corrupt the power spectral density estimation. The spectral crosstalk can be reduced by increasing the number of levels in the basis function $h_Q$ thereby reducing the associated quantization noise.

In another embodiment, the discrete spectral tones of the quantized basis function (quantization noise) are spread in the frequency domain using random dither that is added to the threshold values (e.g., threshold values ⅓ and −⅓ in Equation (14)). By applying a dither, the spectral tones at the integer multiples of the center frequency $f_C$ will be spread as a wide-band noise. As a result, if the input signal has any out-of-band interference, it will be spread before it is folded back to the baseband around $f_C$ reducing its effect on the measurement precision.

Figure 5:
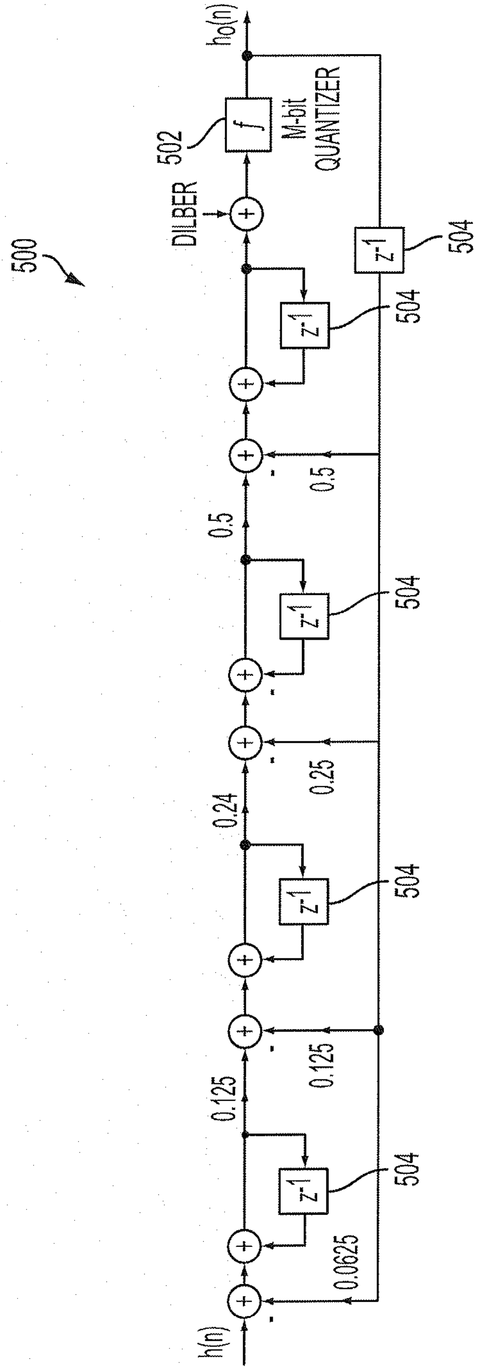
FIG. 5 is a diagrammatic depiction of a sigma-delta ADC architecture in accordance with the present invention.

Referring to FIG. 5 a diagrammatic depiction of a sigma-delta ADC architecture in accordance with the present invention is disclosed. In this embodiment, the basis function may be obtained from the output of the all-digital Sigma-delta modulator. FIG. 5 depicts an example of a $4^{th}$ order all-digital Sigma-delta modulator 500 used to obtain a quantized basis function (transform sequence). The sinusoidal waveform provided in Equation (13) is applied to the input of the L-th order, M-bit all-digital sigma-delta modulator that is operated at the sampling frequency $f_S$ (i.e., output is clocked at $f_S$). The resulting quantized sequence $h^{(2)}{}_Q$ at the output of the sigma-delta modulator will have a strong spectral component at the desired frequency $f_C$, however the quantization noise will be spread and shaped away from the baseband around $f_C$. The order of the Sigma-delta modulator will define the shaping function (i.e., higher order sigma-delta modulators will push more quantization noise power away from the baseband). In addition, the resolution of the quantizer 502 in FIG. 5 will determine the total power of the quantization noise that is introduced into the basis function (i.e., increase in M results in a decrease of the quantization noise power).

In order to maintain low power operation the sentry IC may be implemented in a sub-threshold switched capacitor design. The output of the circuit will be an analog voltage that subsequently will be digitized by a course ADC. The output value of the course ADC is compared to a set threshold. If the threshold value is exceeded, the output value of the ADC is stored and/or transmitted. In addition, the Info-Sensor control logic may decide to activate a high-resolution ADC for more precise spectral analysis.

In another implementation of the vibration Info-Sensor, the sentry IC may perform a matched filtering operation. In this mode, the sentry IC cross-correlates an input signal with a predetermined signal that represents a signature of the sought-for event. The output of the matched filter is then compared with the set threshold. If the threshold is exceeded, the Info-Sensor may decide to record the event in local memory for later processing or it may transmit an alarm signal through the network to a user.

Using the illustrative example of vibration sensing for machine monitoring, the vibration power in a selected band of frequencies, e.g., from 3 kHz to 5 kHz, is monitored to detect bearing failure. The conventional approach samples the analog output sensor using 16 bits of resolution at a 10 kHz sampling frequency and performs a Fast Fourier Transform (FFT) of the sampled data to generate a vibration power spectrum. This process generates 160 kilo-Bytes of data per second and requires that a 10,000 point FFT be performed each second. The required processing power is approximately 50 mW with currently available ADC-DSP resources. In contrast, the present invention only employs low power analog signal processing that includes switched capacitor analog circuits integrated with the sensor. This approach enables measurement of the vibration power in a selected frequency band for a power consumption that is in a range of tens of nW, which is five orders of magnitude lower than conventional designs. In one embodiment, the information of interest is counterintuitively measured in the analog domain and converted into the digital domain to generate a single digital word that represents the sought-for information. Because the DSP and COMM units require greater power when they are running, uses these units sparingly, i.e., when a fault condition is detected or to provide periodic machine health updates.

The sentry circuit most often is an analog circuit but it is not limited to the analog domain. The sentry continuously monitors some quantity of interest such as vibration, acceleration, an acoustic signal, an image, or any other physical quantity that may be sensed from the environment. The sentry circuit may be configured to implement one or more signal processing algorithms (usually in the analog domain but not limited to this domain) such as correlation, template matching, energy measurement, power spectrum measurement, matched filtering, wavelet decomposition, or any other transform utilizing a set of basis functions, or any other quantity that may be computed from the raw signal. The sentry circuit may be followed by a threshold detection circuit that indicates if a pre-determined threshold for the measured quantity is exceeded. The output of the sentry circuit is sent to an analog to digital converter to convert the measured quantity to digital format for subsequent storage or transmission.

While preferred embodiments of the present invention have been set forth in detail above, those skilled in the art who have reviewed the present disclosure will readily appreciate that other embodiments can be realized within the scope of the invention. For example, numerical values are illustrative rather than limiting, as are disclosures of specific types of sensors and of sources for components. Therefore, the present invention should be construed as limited only by the appended claims.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening.

The recitation of ranges of values herein are merely intended to serve as a shorthand method of referring individually to each separate value falling within the range, unless otherwise indicated herein, and each separate value is incorporated into the specification as if it were individually recited herein.

All methods described herein can be performed in any suitable order unless otherwise indicated herein or otherwise clearly contradicted by context. The use of any and all examples, or exemplary language (e.g., "such as") provided herein, is intended merely to better illuminate embodiments of the invention and does not impose a limitation on the scope of the invention unless otherwise claimed.

No language in the specification should be construed as indicating any non-claimed element as essential to the practice of the invention.

It will be apparent to those skilled in the art that various modifications and variations can be made to the present invention without departing from the spirit and scope of the invention. There is no intention to limit the invention to the specific form or forms disclosed, but on the contrary, the intention is to cover all modifications, alternative constructions, and equivalents falling within the spirit and scope of the invention, as defined in the appended claims. Thus, it is intended that the present invention cover the modifications and variations of this invention provided they come within the scope of the appended claims and their equivalents.

What is claimed is:

1. A circuit device configured to monitor a sensor device, the sensor device being configured to measure a predetermined physical parameter and provide a sensor output signal corresponding to the predetermined physical parameter, the circuit device comprising:

a sampling circuit configured to sample the sensor output signal at a predetermined sampling rate to thereby obtain a predetermined number (N) of sensor output signal samples, N being an integer value;

an analog multiplication circuit coupled to the sampling circuit, the multiplication circuit being selectably reconfigurable to generate any one of a plurality of predetermined digital sequences, each predetermined digital sequence of the plurality of predetermined digital sequences including a sequence of N coefficients, the multiplication circuit being configured to multiply each sensor output signal sample by a corresponding coefficient in a selected predetermined digital sequence to thereby generate a sequence of N multiplication products; and an analog integrator circuit coupled to the analog multiplication circuit, the analog integrator circuit being configured to add the N multiplication products to generate an analog signal power estimation value, the analog signal power estimation value corresponding to a degree of correlation between the sensor output signal and the selected predetermined digital sequence.

2. The device of claim 1, further comprising a clock generation circuit coupled to the sampling circuit, the clock generation circuit being configured to generate a sampling clock to sample the sensor output signal at the predetermined sampling rate.

3. The device of claim 2, wherein the analog multiplication circuit further comprises a switch matrix including a plurality of multiplication switches, the clock generation circuit being configured to generate a plurality of sequence multiplication clocks configured to control the plurality of multiplication switches such that each sensor output signal sample is multiplied by the corresponding coefficient in substantial synchronism with the sampling clock.

4. The device of claim 2, wherein the clock generation circuit is configured to generate a periodic reset pulse configured to reset the analog integrator circuit.

5. The device of claim 4, wherein the periodic reset pulse is synchronous with the sampling clock such that the analog integrator circuit is reset after the N multiplication products are added.

6. The device of claim 1, further comprising a reset circuit configured to reset the analog integrator circuit in response to a reset pulse.

7. The device of claim 1, further comprising an array of switched capacitors coupled to the analog integrator circuit, the array of switched capacitors being configured to control the gain of the analog integrator circuit.

8. The device of claim 7, wherein the array of switched capacitors includes a first sampling capacitor characterized by a first capacitance and at least one second capacitor characterized by at least one second capacitance, the first sampling capacitor and the at least one second sampling capacitor being selected to implement a predetermined gain sequence.

9. The device of claim 8, wherein the predetermined gain sequence includes a sequence of M capacitive samples, each capacitive sample being selected from a list of predetermined values corresponding to a sequence of real numbers.

10. The device of claim 1, wherein the predetermined physical parameter is selected from a group of predetermined physical parameters comprising acceleration, vibration, strain, torque, force, pressure, acoustic signals, electric fields, magnetic fields, electromagnetic signals, or optical signals.

11. The device of claim 1, wherein the sensor device is selected from a group of sensor devices including an accelerometer, a vibrational sensor, a strain sensor, a force sensor, a torque transducer, a pressure transducer, capacitive transducer, or an inductive transducer.

12. The device of claim 1, wherein the sensor output signal is a voltage signal, a current signal, an optical signal or an electric charge signal.

13. The device of claim 1, wherein the selected predetermined digital sequence is selected from the plurality of predetermined digital sequences based on a timing sequence associated with the multiplication circuit.

14. The device of claim 1, wherein the plurality of predetermined digital sequences correspond to quantized Fourier sine basis functions, quantized Fourier cosine basis functions, or quantized Hadamard basis functions.

15. The device of claim 1, wherein the sensor output signal is configured to serially provide multi-dimensional data.

16. The device of claim 15, wherein the multi-dimensional data corresponds to a two-dimensional image.

17. An alarm circuit comprising:

a sensor configured to measure a predetermined physical parameter and provide a sensor output signal corresponding to the predetermined physical parameter;

a sampling circuit configured to sample the sensor output signal at a predetermined sampling rate to thereby obtain a predetermined number (N) of sensor output signal samples, N being an integer value;

an analog multiplication circuit coupled to the sampling circuit, the multiplication circuit being selectably reconfigurable to generate any one of a plurality of predetermined digital sequences, each predetermined digital sequence of the plurality of predetermined digital sequences including a sequence of N coefficients, the multiplication circuit being configured to multiply each sensor output signal sample by a corresponding coefficient in a selected predetermined digital sequence to thereby generate a sequence of N multiplication products; and an analog integrator circuit coupled to the analog multiplication circuit, the analog integrator circuit being configured to add the N multiplication products to generate an analog signal power estimation value, the analog signal power estimation value corresponding to a degree of correlation between the sensor output signal and the selected predetermined digital sequence; and a processing circuit coupled to the analog integrator circuit, the processing circuit being configured to process the analog signal power estimation value to determine whether the analog signal power estimation value corresponds to an alarm condition.

18. The circuit of claim 17, wherein the processing circuit includes an analog-to-digital converter (ADC) configured to generate a digitized analog signal power estimation value.

19. The circuit of claim 18, wherein the processing circuit is configured to derive a power spectral density associated from the digitized analog signal power estimation value.

20. The circuit of claim 18, wherein the processing circuit includes a threshold detector, the threshold detector signaling the alarm condition based on the digitized analog signal power estimation value relative to a predetermined threshold.

21. The circuit of claim 20, wherein the alarm condition is signaled if the digitized analog signal power estimation value exceeds the predetermined threshold or if the digitized analog signal power estimation value is below the predetermined threshold.

22. The circuit of claim 17, further comprising a clock generation circuit coupled to the sampling circuit, the clock generation circuit being configured to generate a sampling clock to sample the sensor output signal at the predetermined sampling rate.

23. The device of claim 22, wherein the analog multiplication circuit further comprises a switch matrix including a plurality of multiplication switches, the clock generation circuit being configured to generate a plurality of sequence multiplication clocks configured to control the plurality of multiplication switches such that each sensor output signal sample is multiplied by the corresponding coefficient in substantial synchronism with the sampling clock.

24. The device of claim 22, wherein the clock generation circuit is configured to generate a periodic reset pulse configured to reset the analog integrator circuit.

25. The device of claim 24, wherein the periodic reset pulse is synchronous with the sampling clock such that the analog integrator circuit is reset after the N multiplication products are added.

26. The device of claim 17, further comprising a reset circuit configured to reset the analog integrator circuit in response to a reset pulse.

27. The device of claim 17, further comprising an array of switched capacitors coupled to the analog integrator circuit, the array of switched capacitors being configured to control the gain of the analog integrator circuit.

28. The device of claim 17, wherein the predetermined physical parameter is selected from a group of predetermined physical parameters comprising acceleration, vibration, strain, torque, force, pressure, acoustic signals, electric fields, magnetic fields, electromagnetic signals, or optical signals.

29. The device of claim 17, wherein the sensor device is selected from a group of sensor devices including an accelerometer, a vibrational sensor, a strain sensor, a force sensor, a torque transducer, a pressure transducer, capacitive transducer, or an inductive transducer.

30. The device of claim 17, wherein the sensor output signal is a voltage signal, a current signal, an optical signal or an electric charge signal.

31. The device of claim 17, wherein the selected predetermined digital sequence is selected from the plurality of predetermined digital sequences based on a timing sequence associated with the multiplication circuit.

32. The device of claim 17, wherein the plurality of predetermined digital sequences correspond to quantized Fourier sine basis functions, quantized Fourier cosine basis functions, or quantized Hadamard basis functions.

33. The device of claim 17, wherein the sensor output signal is configured to serially provide multi-dimensional data.

34. A sensor system comprising:

a sensor configured to measure a predetermined physical parameter and provide a sensor output signal corresponding to the predetermined physical parameter;

an analog monitoring circuit configured to consume approximately a first predetermined power amount, the analog monitoring circuit including, a sampling circuit configured to sample the sensor output signal at a predetermined sampling rate to thereby obtain a predetermined number (N) of sensor output signal samples, N being an integer value, an analog multiplication circuit coupled to the sampling circuit, the multiplication circuit being selectably reconfigurable to generate any one of a plurality of predetermined digital sequences, each predetermined digital sequence of the plurality of predetermined digital sequences including a sequence of N coefficients, the multiplication circuit being configured to multiply each sensor output signal sample by a corresponding coefficient in a selected predetermined digital sequence to thereby generate a sequence of N multiplication products, and an analog integrator circuit coupled to the analog multiplication circuit, the analog integrator circuit being configured to add the N multiplication products to generate an analog signal power estimation value, the analog signal power estimation value corresponding to a degree of correlation between the sensor output signal and the selected predetermined digital sequence;

a detector circuit coupled to the analog monitoring circuit, the detector being configured to evaluate the analog signal power estimation value in accordance with a predetermined detection rule and generate an alarm signal if the analog signal power estimation value substantially corresponds to the predetermined detection rule; and a signal processing unit coupled to the sensor and the detector circuit, the signal processing unit being configured to operate in a minimal power mode such that the signal processing unit is substantially deactivated, the signal processing unit being activated in response to the alarm signal to thereby enter an operational mode, the signal processing unit being configured to process the sensor output signal in the operational mode, the signal processing unit being configured to consume a second predetermined power amount in the operational mode.

35. The system of claim 34, wherein a ratio of the second predetermined power amount over the first predetermined power amount is approximately 10,000.

36. The system of claim 34, wherein the predetermined detection rule includes a threshold detection rule.

37. The system of claim 34, wherein the selected predetermined digital sequence is selected from the plurality of predetermined digital sequences based on a timing sequence associated with the multiplication circuit.

38. The system of claim 34, wherein the plurality of predetermined digital sequences correspond to quantized Fourier sine basis functions, quantized Fourier cosine basis functions, or quantized Hadamard basis functions.

39. The system of claim 34, wherein the sensor output signal is configured to serially provide multi-dimensional data.

40. The system of claim 34, wherein the sensor device is selected from a group of sensor devices including an accelerometer, a vibrational sensor, a strain sensor, a force sensor, a torque transducer, a pressure transducer, capacitive transducer, or an inductive transducer, and wherein the predetermined physical parameter is selected from a group of predetermined physical parameters comprising acceleration, vibration, strain, torque, force, pressure, acoustic signals, electric fields, magnetic fields, electromagnetic signals, or optical signals.

41. The system of claim 34, wherein the sensor system is substantially disposed in an integrated circuit (IC).

42. The system of claim 41, wherein the integrated circuit (IC) is a CMOS IC.

* * * * *